United States Patent [19]

Bryant et al.

[11] Patent Number: 5,473,729
[45] Date of Patent: Dec. 5, 1995

[54] CRITICAL INCIDENT RECORDER

[76] Inventors: David P. Bryant; Gene M. Nitschke, both of 159 W. Main St. #201, Webster, N.Y. 14580

[21] Appl. No.: 953,952

[22] Filed: Sep. 30, 1992

[51] Int. Cl.⁶ .................................................... G10L 9/00
[52] U.S. Cl. ........................................................ 395/2.79
[58] Field of Search ............. 381/51–53; 395/2.79–2.84; 369/19–21, 50; 365/45; 379/68; 360/5, 6, 32, 74.1

[56] References Cited

U.S. PATENT DOCUMENTS

| | | | |
|---|---|---|---|
| 4,698,776 | 10/1987 | Shibata | 395/2 |
| 4,791,741 | 12/1988 | Kondo | 395/2 |
| 5,056,145 | 10/1991 | Yamamoto et al. | 395/2 |
| 5,140,436 | 8/1992 | Blessinger et al. | 360/5 |

*Primary Examiner*—Allen R. MacDonald
*Assistant Examiner*—Michelle Doerrler

[57] ABSTRACT

A portable, continuous loop, microchip recording device which stores sound prior to and for a preset period after a timer is triggered by either a manual switch, a preprogrammed acoustical signature, or when a preset decibel or pressure level is reached.

2 Claims, 1 Drawing Sheet

CRITICAL INCIDENT RECORDER

BACKGROUND OF THE INVENTION

1. Field of the Invention

This invention relates in general to recording devices and in particular to a portable, electronic, continuous loop, microchip recorder with a preprogrammed acoustically triggered timer, to enable the collection and storage of audio information before and after the triggering event.

2. Description of Prior Art

Previously, law enforcement officers involved in gunfights, or other deadly force encounters, relied upon their memory and the memory of witnesses to recount events. It is well known that under the extreme stress of a critical incident, perception and recollection can be distorted. Witnesses affected by personal bias can fabricate or delete important bits of information, consciously or subconsciously, that could have a great effect on how an individual's actions are judged.

It also occurs that an officer killed at a scene is unable to give any information to investigators that would aid them in reconstructing what happened.

A small tape recorder carried by an officer is a a useful tool in these situations, but requires a prior awareness on the part of the officer that he is about to encounter a critical situation and should turn it on. This type of foresight is simply unrealistic given the element of surprise so common in such incidents.

Occasionally a critical incident has been recorded via police radio transmission, or by on scene video equipment. The recordings in such cases proved invaluable in identifying suspects, determining innocence of an officer, and as evidence in criminal proceedings.

There exists several devices which record acoustical signals in a digital format (several are disclosed in commonly assigned U.S. Pat. No. 4,698,776 U.S. Pat. No. 4,791,741 and U.S. Pat. No. 5,056,145). All of these devices can record and play back audio signals but, they have no method of operating in a continuous loop mode or to record pre and post triggered events.

Devices previously created for pre and post event recordings were large and bulky. They were desired for Fast Frame Video Recordings to eliminate the need for magnetic tape recording formats. One such type is disclosed in commonly assigned U.S. Pat. No. 5,140,436. The drawback of this device is that it was not designed for portable audio recording or to be triggered automatically from a predetermined acoustical event.

No device is known, that could be easily carried by an officer, which would continually record the ambient sound, and automatically stop and save the sounds gathered, bracketing the time frame of an unforeseen critical incident.

SUMMARY OF THE INVENTION

The principal object of this invention is to provide a device to be carried by individuals to record sound on a continuous basis and save the recorded information after an internal timer expires which is triggered by an audible signal.

The device stores recorded sounds in memory in a continuous loop fashion with the most recent sounds replacing the oldest. The device features a "stop and save" timing control that can be activated manually and/or automatically by a preprogrammed acoustical "trigger" such as the sound of a gunshot. The device will continue to record for a specified period of time after the trigger activates the timer, then the device will shut down saving the recorded data in memory to be retrieved at a future time.

BRIEF DESCRIPTION OF THE DRAWING

The Continuous Loop Digital Recorder With Sound Activated Shutdown Timer is a device used to digitally record the audible events prior to and for a preset time after a preprogrammed acoustically triggered event occurs.

The device consists of a Digital Processor, Preprogrammed Memory, recording memory, Clocking circuitry, Input/output circuitry and power supply.

Figure 1:
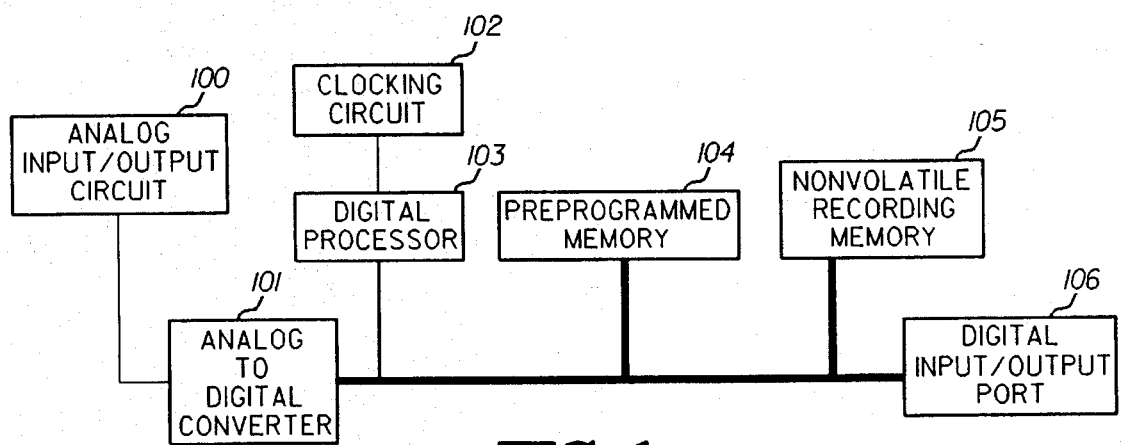
FIG. 1 is a simplified block diagram of the device.

This device requires the preprogramming and sampling of an audio signal (trigger) in digital form to act as the pattern for the processor to determine if a triggering event has occurred. The length of pre and post trigger recording must also be preprogrammed into the device. This preprogramming is accomplished external to the device and by use of personal style Computer. The Programmed Memory is programmed externally of the device and is inserted during final assembly. Optionally, the device may be programmed by use of an external computer and the optional I/O port.

Once the device is activated, audio is received by the Analog Input/Output Circuit 100 and filtered. Next the audio signal is digitized (sampled) by the Analog to Digital Converter 101. The Digital Processor 103 compares the digitized audio with a prestored sampling of the triggering signal (within the Programmed Memory 104).

If the compared signal is not the triggering signal:

The digitized signal is compressed by the Digital Processor 103 and stored in NonVolatile Recording Memory 105, then the next sample is compared. The NonVolatile Recording Memory 105 continually overwrites itself in a loop fashion.

If the sampled signal is the triggering signal:

The digitized signal is compressed (if desired) by the Digital Processor 103 and stored in NonVolatile Recording Memory 105, then the shutdown timer is started. Audio continues to be sampled and stored until the shutdown timer expires. At the time the shutdown timer expires, an index pattern is stored in memory to locate the ending (and subsequently, the starting) point in memory. The memory will continue to contain the recording until retrieved and/or reset.

The memory is non-volatile such that it will continue to retain the recorded information even if the power source is removed or drained. The length of the recording (pre and post trigger) is determined on the amount of memory in the device, type of analog or digital compression used and the length of the preset timer. All of these will vary depending on customers needs, wants and advances in technology.

The device may contain an Input/Output port (I/O port) to allow for programming of the device, resetting, as well as retrieval of the information after triggering.

The device is sealed in such a manor that there will be visible indications if there was an attempted opening of the device by other than authorized personnel. The device may have external openings or contacts (if requested by the customer) for battery charging, for resetting or for I/O port.

The device can be reset in several methods depending on the customer requirements. The unit can be reset every time:

1) it is inserted into the charger.
2) an electronic key is inserted
3) a special jumper connector is inserted onto the Digital Input/Output Port 106.
4) or when, commanded to by an external computer via the Digital Input/Output Port 106. Connectors may be provided on the circuit board to connect to an external Personnel Computer which can reactivate the circuit for reset or retrieval of the stored digitized audio signal.

Retrieving can be accomplished in any of several methods:

1) via the Digital Input/Output Port 106 and an external computer. Via the I/O port the devices processor can be reactivated and placed into a playback mode where all of the digital information will be transferred into the external computers memory for processing. The information can be extracted from the digital sound and both can be reconstructed into their appropriate forms for playback.
2) circuitry can be attached to the Digital Input/Output Port 106 that places the devices processor into a playback mode and allows for the conversion of the digital sound and information into the analog equivalents for listening and recording onto other media or devices.
3) With the Optional Output Circuitry and any of the above mentioned reset methods used to activate playback.

BEST MODE FOR CARRYING OUT THE INVENTION

Figure 2:
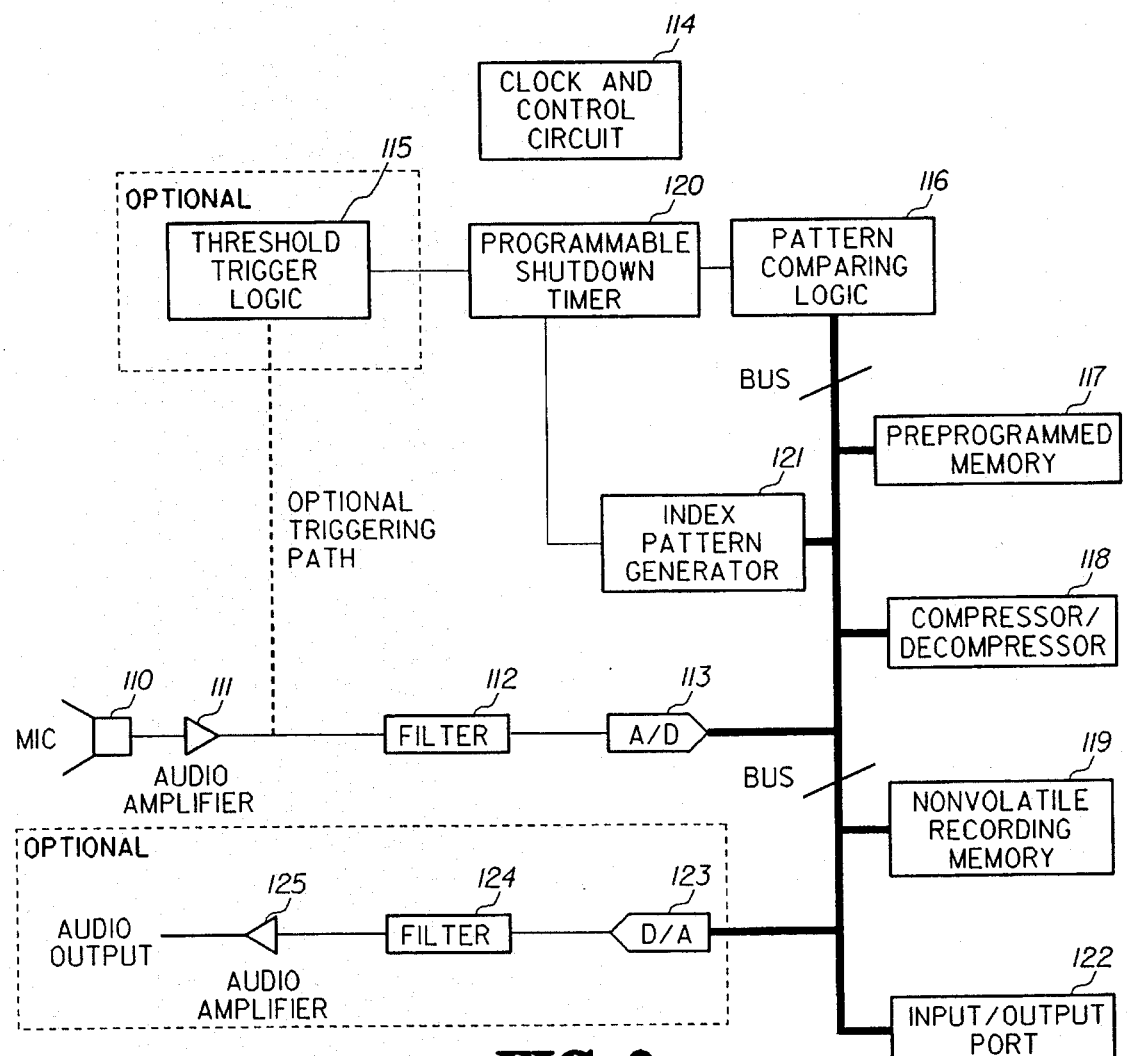
FIG. 2 is a detailed black diagram of the device.

Refer to FIG. 2 for location of described modules. Many of the blocks described in this figure can and may be combined onto one or more electronic components within the device.

The audio signal from the Microphone 110 may take two paths. The first of which is the recording and sampling path, the second is the optional triggering path.

The recording path is made up of a low gain Audio Amplifier 111 to bring the signal levels up to usable levels for the rest of the circuitry. Next the signal is Filtered 112 to reduce the number of frequencies to be sampled. The signal is next digitized by the use of an Analog to Digital Converter (A/D) 113. The A/D converts the (optional) filtered analog audio signal into digital data words. The processor compares the data words to previously programmed triggering word or words located within the Preprogrammed Memory 117.

If the data matches the preprogrammed triggering data, a Programmable Shutdown Timer 120 is activated. Once this countdown timer expires the Clock and Control Logic 114 stops counting. The data words are then compressed to reduce required memory storage space by the Compressor 118. The compressed digital data is then docked into locations in the NonVolatile Recording Memory 119. The Clock and Control Logic 114 is used for clocking all modules within the device.

When the Pattern Comparing Logic 116 detects a trigger it activates the Programmable Shutdown Timer 120. When the Programmable Shutdown Timer expires, the next addressed memory location is loaded with an index pattern from the Index Pattern Generator 121 and the Clock and Control Logic 114 stops clocking,. This index pattern is used to locate the starting, and stopping, points in memory of the recording.

The Clock and Control Logic 114 is also used for controlling the record and/or playback (read and/or write) operation of the device as well as assisting in power conservation of unused circuitry.

The second path that the audio may take is to the Optional Trigger Logic 115. This Trigger Logic 115 can take several forms:

a) An audio decibel threshold. This would trigger if a noise above a predetermined level was detected.
b) A pressure threshold. This would consist of a pressure transducer and threshold logic. When a preprogrammed pressure threshold is exceeded the device will trigger
c) A manual switch so the user may trigger the device should they desire.
d) Any combination of the above.

The output of the trigger logic is fed into a Programmable Shutdown Logic 120 which is used to continue the recording sequence for a preset amount of time (the preset time is dependent on user requirements and amount of recording memory). After the timer within the Programmable Shutdown Logic 120 has expired the clocking for all logic ceases (via the Clock and Control Logic 114), but the data stored in the NonVolatile Recording Memory 119 is unaffected.

RETRIEVAL LOGIC

In most cases, the case of the device must be disassembled for access to the retrieval logic (dependent on customer wants and needs). The case of the device is designed such to make any tampering will be obvious. The device contains logic to allow for the retrieval the signal, but the exact procedure will not be revealed to the user to maintain security and prevent tampering with the memory. The unit must be returned to personnel knowledgeable in the use of and in possession of the necessary equipment for the retrieval of the data.

There are two methods for retrieving the recorded data:

1. Using the Input/Output Port 122 and an external computer with the appropriate software. The external computer can tell the Clock and Control Logic 114 to change the device's operation from writing to NonVolatile Recording Memory 119 to reading from NonVolatile Recording Memory 119 by toggling the read/write portion and re enabling the clock within the Clock Control Logic 114. The digital data can then be down loaded to the external computer or passed to the internal Decompressor 118, then to an external D/A (Digital to Analog Converter) 123, external Filter 124 and external amplifier logic (125). The signal after the amplifier 125 may be recorded on other media or played through a speaker. The external computer may also process the data and return it to an analog audio signal for analysis and rerecording onto other media without the need for the Optional Output Circuitry 123, 124, 125.

2. Optional Output Circuitry 123, 124, 125 may be added within the device to allow playback of the recording without the need for an external computer. In this case, a specialized connector is attached to the Input/Output Port 122, that automatically tells the Clock and Control Logic 114 to change the device's operation from writing to NonVolatile Recording Memory 119 to reading from NonVolatile Recording Memory 119 by toggling the read/write portion and reenabling the clock within the Clock Control Logic 114. The signal after the amplifier 125 may then be recorded on other media or played through a speaker.

We claim:

1. A portable sound recording device comprising: a digital processor which receives sound through an analog input circuit and records the received sound digitally in a microchip memory in a loop fashion whereby the oldest sound is replaced with the latest received sound and compares the received sound to either a stored, decibel threshold level, or to a stored, preprogrammed acoustical signature to determine if a specific criteria has been satisfied and once the criteria has been satisfied, stops recording the received sound after a preset time has transpired thereby enabling the collection and storage of incoming sound both before and after the specified criteria is satisfied.

2. A portable sound recording device as claimed in claim 1, further comprising an output port which enables retrieval of the stored sound.

* * * * *